United States Patent [19]

Yamazaki

[11] Patent Number: 4,957,900

[45] Date of Patent: Sep. 18, 1990

[54] METHOD OF MANUFACTURING A SUPERCONDUCTING PATTERN BY LIGHT IRRADIATION

[75] Inventor: Shumpei Yamazaki, Tokyo, Japan

[73] Assignee: Semiconductor Energy Laboratory Co., Ltd., Hase Atsugi, Japan

[21] Appl. No.: 174,503

[22] Filed: Mar. 28, 1988

[30] Foreign Application Priority Data

Apr. 7, 1987 [JP] Japan .................................. 62-86494

[51] Int. Cl.[5] ........................ H01L 39/12; B05D 5/12

[52] U.S. Cl. ........................................ 505/1; 505/701; 505/705; 505/728; 505/731; 505/742; 156/643; 426/62; 426/63

[58] Field of Search .......................... 427/53.1, 62, 63; 156/643; 505/1, 701, 705, 720, 731, 742

[56] References Cited

U.S. PATENT DOCUMENTS 4,081,653 3/1978 Koo et al. .......................... 427/53.1

FOREIGN PATENT DOCUMENTS 0020486 2/1982 Japan .
225807 10/1986 Japan .

OTHER PUBLICATIONS

Inam et al., *Appl. Phys. Lett.* 51(14), Oct. 5, 1987.

Kawasaki et al., *Jap. J. of Appl. Phys.*, vol. 26, No. 4, Apr. 1987, pp. 388–390.

Koinuma et al., *Jap. J. of Appl. Phys.*, vol. 26, No. 5, May 1987, pp. L763–L765.

Bednorz et al., *Z. Phys. B–Condensed Matter* 64, 189–193 (1986).

Applied Physics A, vol. 40, No. 4, Aug. 1986, pp. 235–239, Springer–Verlag; M. Eyett et al.; "Laser–Induced Chemical Etching of Ceramic PbTil–xZro)3".

Sov. Phys. Solid State, vol. 25, No. 1, Jan. 1983, pp. 100–103, American Institute of Physics; S. V. Zaitsev–Zotov et al.; "Superconductivity of BaPbl–xBix)3 Films Prepared by Laser Evaporation Method".

Japanese Journal of Applied Physics, vol. 20, supplement 20–4, 1981, pp. 13–16; M. Suzuki, et al.; "Thin Film Preparation of Superconducting Perovskite–Type Oxides by RF Sputtering."

Applied Physics Letters, vol. 51, No. 23, Dec. 7th 1987, pp. 1951–1953, American Institute of Physics, New York, N.Y., U.S.; M. Scheuermann et al.; "Magnetron Sputtering and Laser Patterning of High Transition Temperature Cu Oxide Films".

Applied Physics Letters, vol. 51, No. 13, Oct. 5th 1987, pp. 1112–1114, American Institute of Physics, New York, N.Y., U.S.; A. Inam et al.: "Pulsed Laser Etching of High Tc Superconducting Films."

EP–A–) 306 287 (Semiconductor Energy Laboratory Co., Ltd.).

*Primary Examiner*—Norman Morgenstern
*Assistant Examiner*—Margaret Bueker
*Attorney, Agent, or Firm*—Sixbey, Friedman, Leedom & Ferguson

[57] ABSTRACT

A superconducting ceramic film is deposited on a substrate sputtering. In virtue of the low thermal conductivity of ceramic, a laser beam is radiated to the ceramic film in order to remove the irradiated portion by sublimation and produce a pattern on the ceramic film.

13 Claims, 1 Drawing Sheet

3 4 2 1 5

METHOD OF MANUFACTURING A SUPERCONDUCTING PATTERN BY LIGHT IRRADIATION

BACKGROUND OF THE INVENTION

This invention relates to a method of manufacturing a superconducting pattern by light irradiation.

There have been known the use of metallic materials such as $Nb_3Ge$, with which it is possible to wind a coil to form a superconducting magnet having a high Tc since a metallic material has a high ductility and malleability. On the other hand, such a metallic material requires the use of liquid helium when operated in superconduction. In recent years, superconducting ceramics are attracting interest of researchers which have a high Tc.

However, such superconducting ceramics are fragile because of low ductility and malleability so that it is entirely impossible to form a superconducting coil with a wire made of such superconducting ceramics.

SUMMARY OF THE INVENTION

It is therefore an object of the invention to provide a high Tc superconductor in the form of wire or strip.

It is therefore an object of the invention to provide a method of manufacturing a high Tc superconductor in the form of wire or strip which is suitable for mass-production.

In accordance with one aspect of the present invention, an oxide (or carbonate) mixture for constituting a superconducting ceramic is first formed in the form of a thin film on a substrate by sputtering, printing such as screen press printing or other methods. When deposited by sputtering, the structure of the ceramic material of the film becomes amorphous or another structure which are abundant in lattice defect or imperfection so that the resistivity of the ceramic material is usually rather high. The deposited ceramic can be transformed into a desired superconducting ceramic by thermal oxidation or firing.

The inventor has found that such a ceramic type superconducting film can be easily processed by laser scribing accompanied by sublimation since its thermal conductivity is relatively small. The ceramic film can be processed by laser irradiation before or after firing. For example, a strap of the ceramic material can be removed or remains on a substrate. In this invention, any laser can be employed which is suitable for the case, such as a YAG laser (1.06 micron in wavelength), an excimer laser (KrF, KrCl and so forth), a $CO_2$ laser or an $N_2$ laser. A YAG laser can emit a laser beam having a circular cross section repeatedly at 5 to 100 KHz. When an excimer laser is used, a shaped beam having a cross section of a circle (10–100 microns in diameter) or a linear cross section (10–40 cm wide 5–100 microns long) can be obtained by (expanding and) squeezing with an optical system.

BRIEF DESCRIPTION OF THE INVENTION

DETAILED DESCRIPTION OF THE PREFERRED EMBODIMENTS

Figure 1:
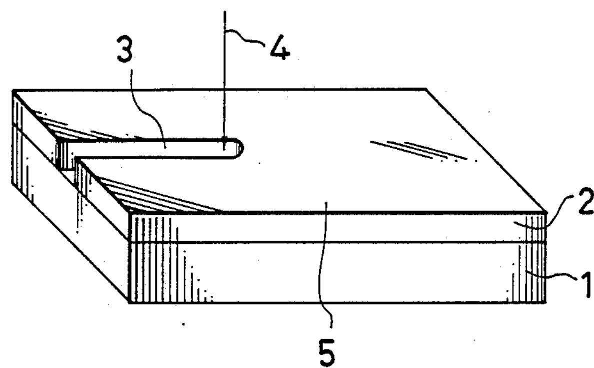
FIG. 1 is a perspective view showing a manufacturing process of superconducting ceramic pattern in accordance with the present invention.

Referring to FIG. 1, a manufacturing process in accordance with the present invention will be described. In FIG. 1(A), a substrate 1 is made of a ceramic material such as alumina, silicon oxide, silicon nitride, aluminium nitride, strontium titanate, zirconia, yttria or YSZ(yttria stabilized zircon), or a metal such as copper or a copper alloy or glass. YSZ, yttria or zirconia are particularly suitable for this case from the view point of the coefficient of thermal expansion rate. Anyway the material should be selected so that the differential coefficient of thermal expansion between the underlying substrate and the ceramic thin film to cover them should be limited preferably within 50% of the ceramic thin film. If the coefficients of the substrate and the ceramic thin film are substantially different, strain may hinder the ceramic film from being recrystallized into superconducting structure by thermal annealing. On the substrate 1 is formed a ceramic film 2 conforming to $YBa_2C_3O_{6-8}$ with 0.1 to 50 micron in thickness, e.g. 20 microns by spattering or printing method such as screen press printing.

The ceramic film 2 is fired at 500–1000° C., e.g. 900° C. for 15 hours and transformed to a superconducting structure. A laser beam having a wavelength of 1.06 microns from a YAG laser is radiated to the superconducting film 2 to produce a pattern thereon. The surface of the film is scanned to the right direction from the left edge as shown in FIG. 1 so that a portion of the film is removed by sublimation leaving a groove 3. The appropriate output power is $10^6$ to $10^7$ W/sec. Stronger irradiation may damage the underlying substrate 1. Alternatively, the laser patterning can be effected before the firing step which transforms the ceramic film into a superconducting structure in which oxygen and copper atoms form a layer-structure.

An excimer laser instead of the YAG laser may be used which is capable of emitting a series of intense laser pulses with a rectangular cross section of $20 \times 30$ mm$^2$ for example. The pulse is shaped into a linear cross section 10 cm wide and 50 microns thick. Each circular pulse is radiated to an irradiating region prescribed on the film which shares a 60–80% area with the irradiating region for the preceding pulse (and also of the subsequent pulse). The scanning speed is 2 m/min. The frequency is 5–30 KHz, e.g. 10 KHz. By virtue of this irradiation, the irradiated portions of the ceramic film are selectively removed by sublimation. The entire substrate may be heated during the laser processing to 300–800° C., e.g. 600° C. by a halogen lamp.

Figure 2:
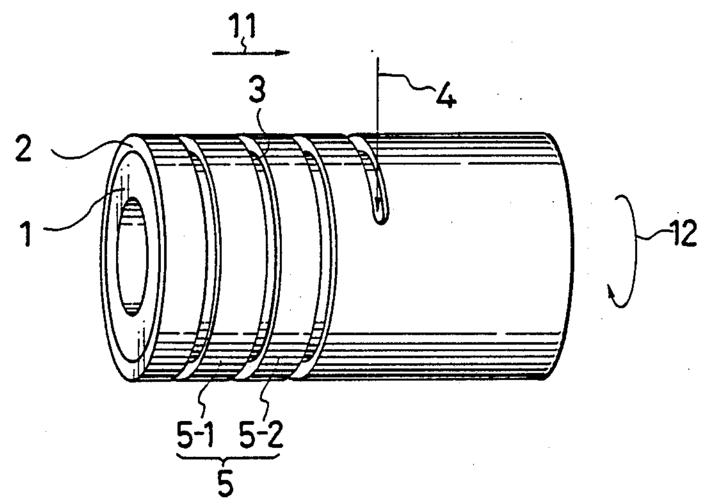
FIG. 2 is a perspective view showing another embodiment of the manufacturing process of superconducting ceramics in accordance with the present invention.

FIG. 2 shows second embodiment of the invention. In this embodiment, substantially same procedure is repeated as the preceding embodiment except described below.

The substrate 1 is a cylinder. On the substrate is deposited a ceramic film 2 while the substrate 1 is rotating in the direction indicated by an arrow 12. After drying the film, a laser beam having a 50 microns diameter is radiated repeatedly to the substrate. The position of the laser beam is shifted to the right direction (the axial direction of the cylinder 1) while the substrate 1 is rotating around its axis. By this process, a continuous helical superconductor 5 is formed on the cylinder 1. Each part of the helix 5-1 is isolated from the adjacent part 5-2 by the helical groove 3 which has been removed by laser sublimation. As a result, a superconducting electromagnet in the form of a coil is constructed.

When laser annealing is utilized in addition to laser sublimation, an advanced process can be performed. First, a ceramic film is formed on a surface in such a way that the film does not have yet superconducting structure. A prescribed portion of the film is melted by irradiation with a laser beam (laser annealing). The irradiated portion is endowed with superconducting property by recrystallization during cooling. In the same time, the ceramic film may be cooled if necessary. Then, another prescribed portion of the ceramic film is removed by laser sublimation. By this process, ceramic pattern which may be composed of superconducting regions and non-superconducting (insulating) regions can be obtained. Whether a laser irradiation is effected as sublimation or annealing is depending on the laser emission condition (laser power or intensity).

Superconducting ceramics for use in accordance with the present invention also may be prepared in consistence with the stoichiometric formulae $(A_{1-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and $x=0-1$; $y=2.0-4.0$, preferably 2.5-3.5; $z=1.0-4.0$, preferably 1.5-3.5; and $w=4.0-10.0$, preferably 6.0-8.0. One example is $YBa_2Cu_3O_{6-8}$. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and $x=0.3-1$; $y=2.0-4.0$, preferably 2.5-3.5; $z=1.0-4.0$, preferably 1.5-3.5; and $w=4.0-10.0$, preferably 6.0-8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40-60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number designating the oxygen proportion is 6-10, e.g. around 8.1.

While a description has been made for several embodiments, the present invention should be limited only by the appended claims and should not be limited by the particular examples.

I claim:

1. A method of manufacturing a superconducting ceramic pattern comprising:
 forming a copper oxide-based superconducting ceramic precursor layer on a surface, said surface formed of a material having a thermal coefficient of expansion of 50%-150% of that of said ceramic layer,
 irradiating and subliming a portion of the ceramic layer with light to remove the irradiated portion, and
 thermally annealing the remaining ceramic layer to render it superconducting.

2. A method of manufacturing a superconducting ceramic pattern comprising:
 forming a copper oxide-based superconducting ceramic precursor layer on a surface, said surface formed of a material having a thermal coefficient of expansion of 50%-150% of that of said ceramic layer,
 thermally annealing the ceramic layer to render it superconducting, and
 irradiating and subliming a portion of the superconducting ceramic layer with light to remove the irradiated portion.

3. A method of manufacturing a superconducting ceramic pattern comprising:
 forming a copper oxide-based superconducting ceramic precursor layer on a surface, said surface formed of a material having a thermal coefficient of expansion of 50%-150% of that of said ceramic layer,
 thermally annealing the ceramic layer to render it superconducting,
 irradiating and subliming a portion of the superconducting ceramic layer with light to remove the irradiated portion, and
 thermally annealing the remaining ceramic layer.

4. The method of claims 1, 2, or 3 wherein said superconducting ceramic precursor layer is deposited on said surface by sputtering.

5. The method of claims 1, 2, or 3 wherein said light is a laser beam.

6. The method of claim 5 wherein said light is a sequence of pulses of laser beam.

7. The method of claim 6 wherein said pulses are radiated to a portion of said ceramic layer tracing a line prescribed thereon.

8. The method of claims 1, 2, or 3 wherein said surface is the periphery of a cylinder and said light is radiated to a helix prescribed on said periphery to form a superconducting coil.

9. The method of claim 8 wherein said cylinder is turning around its axis during said irradiating step while the radiation position of said light is only shifted in the axial direction with respect to said cylinder.

10. The method of claims 1, 2, or 3 wherein said substrate is made of YSZ.

11. The method of claim 1, where said thermally annealing step is conducted in an oxidizing atmosphere.

12. The method of claim 2, where said thermally annealing step is conducted in an oxidizing atmosphere.

13. The method of claim 3, where said thermally annealing steps are conducted in an oxidizing atmosphere.

* * * * *